(12) United States Patent
Prinzen et al.

(10) Patent No.: US 12,404,170 B2
(45) Date of Patent: Sep. 2, 2025

(54) METHOD FOR PRODUCING A BONDING PAD FOR A MICROMECHANICAL SENSOR ELEMENT

(71) Applicant: Robert Bosch GmbH, Stuttgart (DE)

(72) Inventors: Andreas Prinzen, Reutlingen (DE); Christof Schwenk, Stuttgart (DE); Frank Reichenbach, Wannweil (DE); Friedjof Heuck, Stuttgart (DE); Heiko Stahl, Reutlingen (DE); Nicolas Schorr, Reutlingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 402 days.

(21) Appl. No.: 18/151,631

(22) Filed: Jan. 9, 2023

(65) Prior Publication Data

US 2023/0219808 A1 Jul. 13, 2023

(30) Foreign Application Priority Data

Jan. 13, 2022 (DE) ...................... 10 2022 200 343.8

(51) Int. Cl.
*B81C 1/00* (2006.01)

(52) U.S. Cl.
CPC .. *B81C 1/00571* (2013.01); *B81C 2201/0132* (2013.01); *B81C 2201/0198* (2013.01); *B81C 2203/0109* (2013.01)

(58) Field of Classification Search
CPC ........ B81C 2203/0109; B81C 1/00571; B81C 2201/0132; B81C 2201/0198; B81B 7/007; B81B 2203/0361; B81B 2207/07
See application file for complete search history.

(56) References Cited

U.S. PATENT DOCUMENTS

| 2012/0107993 | A1 | 5/2012 | Karlin et al. |
| 2023/0166964 | A1* | 6/2023 | Yamashita ........... B81C 1/00666 73/514.32 |

FOREIGN PATENT DOCUMENTS

| DE | 19820816 A1 | 11/1999 |
| DE | 102014202820 A1 | 8/2015 |

* cited by examiner

*Primary Examiner* — Moazzam Hossain
(74) *Attorney, Agent, or Firm* — NORTON ROSE FULBRIGHT US LLP

(57) ABSTRACT

A method for producing a bonding pad for a micromechanical sensor element. The method includes: depositing a first metal layer onto a top face of the functional layer, and depositing a second metal layer onto the first metal layer, wherein only the first layer or only the second layer is formed in a border region extending around a bonding pad region; covering a protective layer over a top face of the second metal layer in the bonding pad region and over the first or second metal layer in an inner peripheral portion of the border region, which inner peripheral portion adjoins the bonding pad region; etching the first or second layer at least in an outer peripheral portion of the border region down to the top face of the functional layer; removing the protective layer; carrying out an etching process starting from the top face of the layered structure.

14 Claims, 10 Drawing Sheets

# METHOD FOR PRODUCING A BONDING PAD FOR A MICROMECHANICAL SENSOR ELEMENT

CROSS REFERENCE

The present application claims the benefit under 35 U.S.C. § 119 of German Patent Application No. DE 10 2022 200 343.8 filed on Jan. 13, 2022, which is expressly incorporated herein by reference in its entirety.

FIELD

The present invention relates to a method for producing a bonding pad for a micromechanical sensor element. The present invention further relates to a micromechanical sensor element.

BACKGROUND INFORMATION

In the field of producing electronic components, a singulation process known as 'dicing by grinding' is available, in which, as a sub-step, a film is laminated under vacuum into a bonding pad cavity deep down between bonding pads. Next, wafers are polished on a polishing platform until such a point as they are singulated. Lastly, the film is pulled off again.

SUMMARY

An object of the present invention is to provide an improved method for producing a bonding pad for a micromechanical sensor element.

According to a first aspect of the present invention, the object may be achieved by a method for producing a bonding pad for a micromechanical sensor element. According to an example embodiment of the present invention, the method comprises the following steps:
  a) supplying a layered structure having a micromechanical functional layer on a top face of the layered structure;
  b) depositing a first metal layer of a first thickness onto a top face of the functional layer, and depositing a second metal layer of a second thickness onto the first metal layer, wherein either only the first layer or only the second layer is formed in a border region extending around a bonding pad region,
  c) covering a protective layer over a top face of the second metal layer in the bonding pad region and over the first or second metal layer in an inner peripheral portion of the border region, which inner peripheral portion adjoins the bonding pad region,
  d) etching the first or second layer at least in an outer peripheral portion of the border region down to the top face of the functional layer, wherein the inner peripheral portion of the border region remains covered with the first layer,
  e) removing the protective layer,
  f) carrying out an etching process in the exposed portion of the border region starting from the top face of the layered structure, wherein a bonding pad region having the bonding pad is released from a surrounding bonding frame region, wherein the second layer is used as an etching mask, and
  g) removing the first or second metal layer from the inner portion of the border region using an unmasked etching process such as to obtain a bonding pad having a peripheral edge region, wherein the edge region is inwardly set back from a peripheral side face of the bonding pad region of the functional layer.

According to a second aspect of the present invention, the object may be achieved by a micromechanical sensor element comprising at least one bonding pad formed in accordance with a proposed method.

Preferred specific embodiments of the method of the presnet invention are disclosed herein.

In one configuration of the present invention, the following method having the following steps is provided:
  h) in a first step, depositing the first metal layer of the first thickness onto the top face of the functional layer, wherein the border extending around the bonding pad region is worked off in the first metal layer, wherein the border extends from a top face of the first metal layer down to the top face of the functional layer;
  i) in a second step, depositing the second metal layer of the second thickness onto the first metal layer and onto the top face of the layered structure in the region of the border;
  j) covering the protective layer over the top face of the second metal layer in the bonding pad region and in the inner peripheral portion of the border, which inner peripheral portion adjoins the bonding pad region,
  k) etching the second layer at least in the outer peripheral portion of the border down to the top face of the functional layer, wherein the inner portion of the border remains covered with the second layer,
  l) removing the protective layer,
  m) carrying out the etching process starting from the top face of the layered structure in order to release the bonding pad region having the bonding pad from the bonding frame region, wherein a trench is formed in particular, wherein the second layer is used as an etching mask; and
  n) removing the second metal layer from the region of the border using the unmasked etching process such as to obtain the bonding pad having the peripheral edge region, wherein the edge region is inwardly set back from a peripheral side face of the bonding pad region (A) of the functional layer.

In a further configuration, a method having the following steps is provided:
  a) in a first step, depositing the first metal layer of a first thickness onto the top face of the functional layer;
  b) in a second step, depositing the second metal layer of a second thickness onto the first metal layer, wherein the border extending around the bonding pad region is worked off in the second metal layer, wherein the border extends from a top face of the second metal layer down to the top face of the first metal layer;
  c) covering the protective layer over the top face of the second metal layer in the bonding pad region and over the first metal layer in the inner peripheral portion of the border, which inner peripheral portion adjoins the bonding pad region,
  d) etching the first layer at least in the outer peripheral portion of the border down to the top face of the functional layer, wherein the inner portion of the border remains covered with the first layer,
  e) removing the protective layer,
  f) carrying out the etching process starting from the top face of the functional layer in order to release the bonding pad region having the bonding pad from the bonding frame region, wherein a trench is formed in particular, wherein the second layer is used as an etching mask; and g) removing the first metal layer from the border using the unmasked etching process such as to obtain the bonding pad having the peripheral edge region, wherein the edge region is inwardly set back from a peripheral side face of the bonding pad region of the functional layer.

In one configuration of the present invention, before the bonding frame region is released, a cap element is fastened to the top face of the functional layer next to the bonding pad by way of a bonding border. Preferably, before the releasing, a top face of the cap element is covered with a second protective layer using an etching method. The second protective layer is removed again once the bonding frame region has been released.

In one configuration of the present invention, a bonding border for connecting a cap element to the functional layer is produced next to the bonding pads at the same time as the bonding pads by way of the first and/or second layer. This simplifies the method.

In a further configuration of the present invention, the border has a width in an x direction or a y direction of around 1.5 µm to 3 µm, in particular 2 µm. This provides enough of an opening for the etching operation in order to make the trench. By way of example, this advantageously helps to ensure that a plurality of bonding pads can be formed next to one another on a small surface area.

In a further configuration of the present invention, the first metal layer is deposited at a thickness that is at least 20% greater, in particular at a thickness that is at least 50% greater, than the second metal layer. This difference in the thicknesses of the first and second metal layers may be sufficient for removing only the second metal layer from the border region using the etching method.

In a further configuration of the present invention, the second metal layer is deposited at a thickness that is at least 20% greater, in particular at a thickness that is at least 50% greater, than the first metal layer. This difference in the thicknesses of the first and second metal layers may be sufficient for removing only the first metal layer from the border region using the etching method.

In one configuration of the present invention, the first metal layer is deposited at a first thickness of around 0.75 µm to 1.5 µm, in particular 1 µm. This layer thickness is sufficient for the proposed method. In this way, an expedient layer thickness for electrically conductively connecting the bonding pad to an interconnected evaluation element (ASIC) can be provided.

In one configuration of the present invention, the second metal layer is deposited at a thickness of around 0.4 µm to 0.6 µm, in particular 0.5 µm. This thickness may be sufficient for forming the cover layer for the inner portion of the border. In this way, a core region of the bonding pad is formed having a thickness of, for example, around 1.5 µm, together with the peripheral border region having a thickness of around 0.5 µm.

In one configuration of the present invention, the second metal layer or the first metal layer is removed from the border region using a dry ion beam etching process, wherein the first or second metal layer is non-selectively stripped in particular using a plasma having an argon ion beam. This method is simple, cost-effective, and sufficient for the above-described method step.

Owing to this 'blanket etching,' a sufficiently thick metal layer of, for example, around 800 nm remains in the middle of the bonding pad, and this is sufficient for effective electrical contact.

In one configuration of the present invention, the first metal layer and the second metal layer are deposited from the same material or from different materials. The method is simple to carry out when the materials are the same. When the materials are different, the materials can be selected in an optimized manner.

In one configuration of the present invention, the first metal layer and/or the second metal layer consist(s) at least partly of aluminum or entirely of aluminum.

A material that is both widely available and also used elsewhere as part of the production process is thus advantageously used.

In one configuration of the present invention, for the purpose of separating micromechanical sensor elements from an array of sensor elements, a film is applied to a top face of the sensor elements and to the bonding pads of the sensor elements, wherein the sensor elements are separated from one another, and wherein the film is then removed from the sensor elements again.

As a result, micromechanical sensor elements can be separated in a simple manner using dicing by grinding.

One advantage of the method according to an example embodiment of the present invention is that edges of a planar, electrically conductive contact region of the bonding pad are formed in a defined manner so as to be offset inwards from a bonding pad edge. This can provide good conditions for subsequent dicing by grinding in a singulation process because, when a film used for this purpose is removed, there is no possibility of tearing off lengths of the first or second metal layer of the bonding pad that protrude out sideways.

The present invention is described in detail below on the basis of several figures in conjunction with further features and advantages. Identical or functionally identical elements have the same reference numerals. The figures are in particular intended to illustrate the main features of the present invention and are not necessarily to scale. For the sake of clarity, it may be that not all the reference numerals are shown in all the figures.

Disclosed method features analogously result from corresponding disclosed device features, and vice versa. In particular, this means that features, technical advantages, and configurations relating to the method result in an analogous manner from corresponding features, technical advantages, and configurations relating to the micromechanical sensor element, and vice versa.

DETAILED DESCRIPTION OF EXAMPLE EMBODIMENTS

Figure 1:
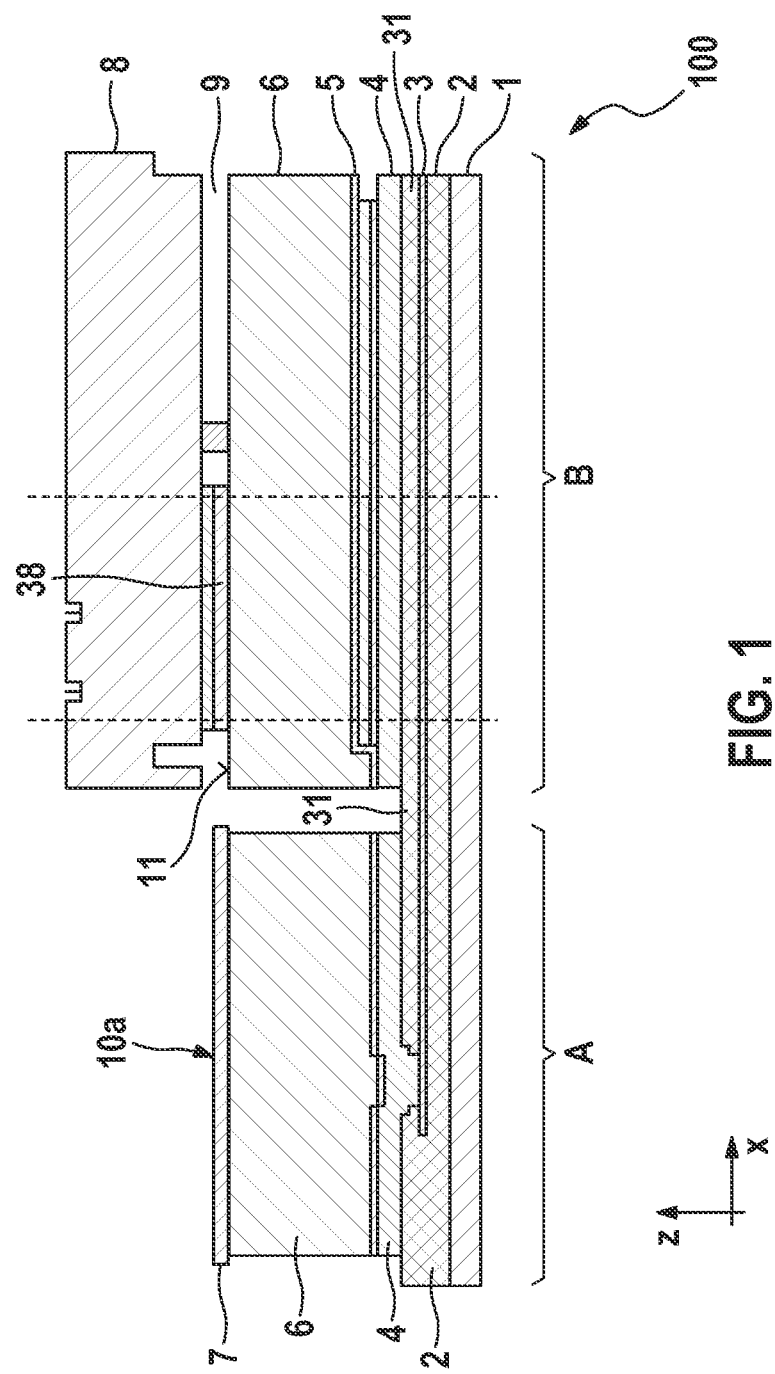
FIG. 1 is a cross-sectional view of part of a micromechanical sensor element, according to an example embodiment of the present invention.

FIG. 1 is a cross section through part of a micromechanical sensor element 100 having a bonding pad region A and a bonding frame region B; an in particular eutectic bonding border 38 can be seen in the bonding frame region B. The part-cross section begins on the left-hand side at an outer edge of the structure and ends on the right-hand side in the middle of a cavity 9 that is formed between a cap element 8 and a functional layer 6 by way of a peripheral bonding border 38 in the form of a metal layer. The rest of the right-hand part of the sensor element is not shown.

A substrate 1 (preferably a Si substrate) can be seen, on which an insulating oxide layer 2 is arranged. Electrically conductive layers 3, 4, 5, preferably made of polysilicon and separated from one another at least partly by further insulating layers 31, can be seen inside and on the oxide layer 2. It can be seen that the cap element 8 is connected, in particular eutectically, to the layered structure therebelow, in particular to the functional layer 6, by way of the peripheral bonding border 38, thereby forming the cavity 9 between the cap element 8 (made of silicon, for example) and the functional layer 6. By way of example, the functional layer 6 of the micromechanical sensor element 100 may be formed as an epitaxially grown silicon. A first metal layer 7, preferably in the form of aluminum, is used to produce electrical contacts in the form of bonding pads 10a in the bonding pad region A and to produce the bonding border 38 in the bonding frame region B.

In FIG. 1, it can be seen that the layered structure 6, 5, 4 has been partly etched starting from a top face 11 in a z direction down to a further insulating layer 31. It can be seen that the metal layer 7 of the bonding pad 10a is formed, in the bonding pad region A, so as to protrude slightly sideways in an x direction on both sides over a support of the functional layer 6; this may have disadvantageous effects in a subsequent dicing-by-grinding singulation process (e.g., in the form of aluminum fragment formation).

Figure 2:
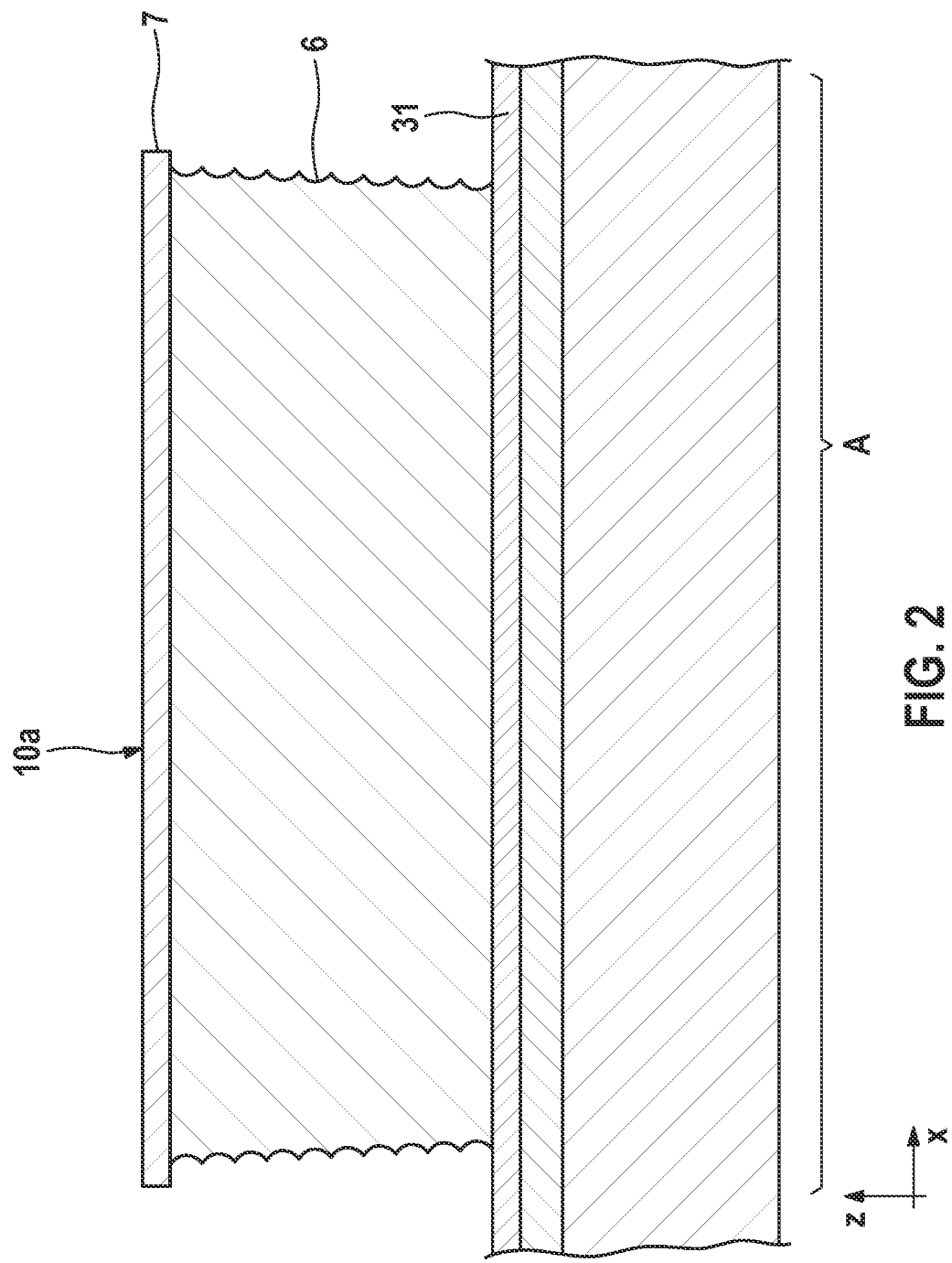
FIG. 2 is a cross-sectional view of a bonding pad from FIG. 1 on a larger scale, according to an example embodiment of the present invention.

FIG. 2 is a more detailed cross-sectional view of the bonding pad 10a from an inertial sensor process, comprising the laterally protruding first metal layer 7 above a released region of the functional layer 6. The inertial sensor production process used to produce the bonding pad 10a is configured such that the first layer 7 of the bonding pad 10a is simultaneously also used as a trench etching mask; the bonding pad opening is exposed during the process for releasing the bonding pad region, and the bonding pads 10a, which were connected by the functional layer 6 up to that point, are electrically insulated from one another at the same time. In the process, the trench ends once it reaches the further insulating layer 31, which is formed, for example, as an oxide layer.

It can be seen that a lateral edge region of the functional layer 6 of the bonding pad 10a is rippled and has a slight undercut with respect to the layer 7, the metal layer 7 of the bonding pad 10a protruding slightly over the side edge of the bonding pad 10a.

In the proposed method, it is possible to avoid the above-described laterally protruding lengths of an electrically conductive layer of the bonding pad 10a. In this case, a metal masking layer is used, which is easy to integrate in the inertial sensor production process; the metal layers may have the following properties:

stable in an Si trench etching process
    stable in a gas phase etching process
    highly selectively etchable with respect to Si (since it has to be structured on the silicon resonator)
    a layer thickness of less than around 1 µm, otherwise it may interact with the bonding border height
    due to the unavoidable under-etching during trenching, the metal masking layer should be able to be removed again dry (physically/chemically) at the end of the process. In this case, Si or $SiO_2$ and metal, in particular Al, are not excessively attacked Aluminum, for example, has proven to be a highly suitable material for the metal layers with respect to said requirements.

However, for the proposed method it is also possible to use other metal materials to form the layers, which also act as the masking layer.

As a result, by way of the proposed method, a bonding pad 10a is created having a lateral edge region that is inwardly set back or recessed from the side edge of the functional layer 6 of the bonding pad region A in a defined manner toward the middle of the bonding pad 10a. Advantageously, this helps to ensure that, in a subsequent packaging process in which a film is laminated on and pulled off during a dicing-by-grinding singulation step, protruding material of the metal layer 7 cannot be torn off by the film. As a result, Al flakes can advantageously be avoided.

Figure 3:
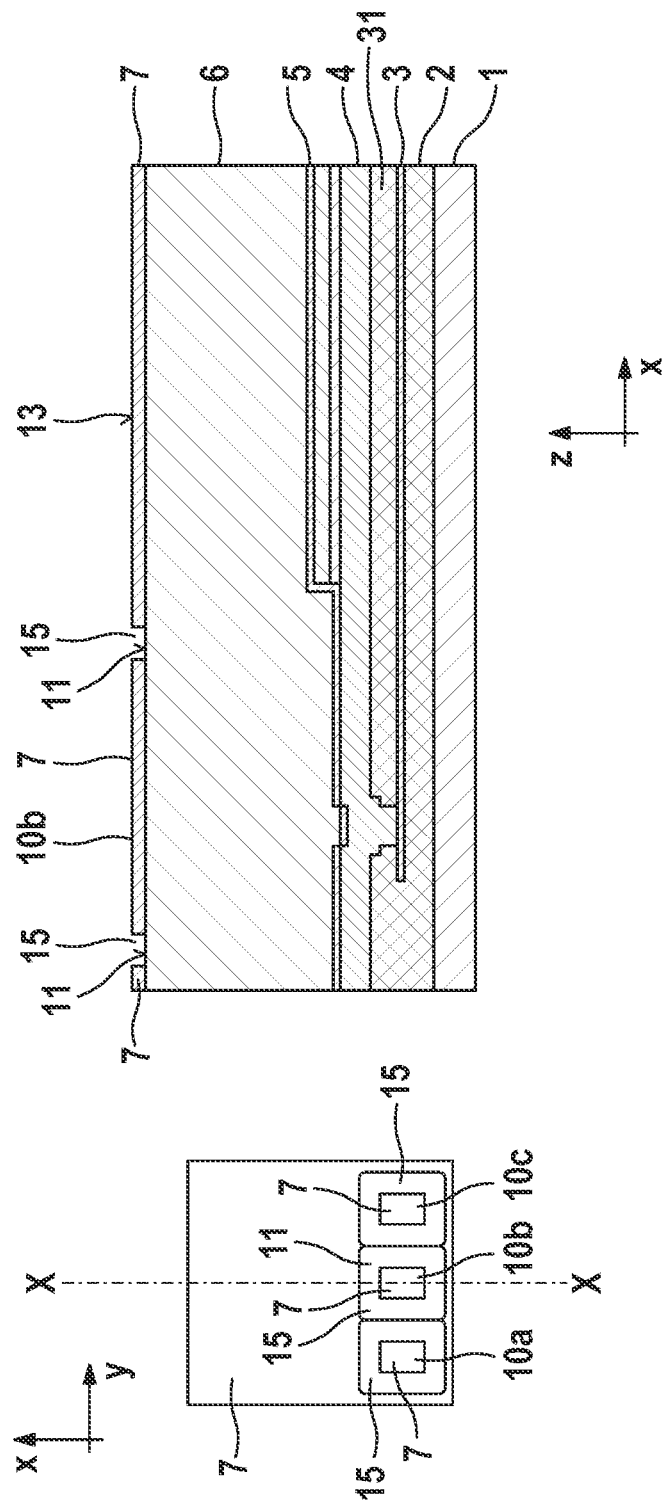
FIG. 3-8 are cross-sectional views of a micromechanical structure as part of the provided production process for producing a bonding pad for a micromechanical sensor element, in various process steps, according to an example embodiment of the present invention.

The left-hand portion of FIG. 3 shows a plan view of the structure having a first metal layer 7, the functional layer, the conductor layers, the insulation layer, the further insulation layer, and the substrate. In the plan view in the left-hand portion of FIG. 3, three bonding pads 10a, 10b, 10c can be seen, around each of which there is formed a border 15 having a recess in the first metal layer 7.

The right-hand portion of FIG. 3 shows a part-cross-sectional view X-X through the middle bonding pad 10b of the three bonding pads 10a, 10b, 10c of the structure. A substrate 1 (preferably a Si substrate) can be seen, on which an insulating oxide layer 2 is arranged. Electrically conductive layers 3, 4, 5, preferably made of polysilicon and separated from one another at least partly by further insulating layers 31, can be seen inside and on the oxide layer 2. By way of example, a functional layer 6 of the micromechanical sensor element 100 may be formed as an epitaxially grown silicon. A first metal layer 7, preferably in the form of aluminum, is used to produce electrical contacts in the form of bonding pads 10a in the bonding pad region A and to produce the bonding border 38 in the bonding frame region B.

In the cross section, it can be seen that a peripheral, closed border 15 is worked off in the first metal layer 7 down to the top face 11 of the micromechanical functional layer 6. In the region of the border 15, the top face 11 of the functional layer 6 is uncovered and free of the first metal layer 7. The border 15 extends from a top face 13 of the first layer 7 as far as the top face 11 of the functional layer 6. The other borders 15 of the further bonding pads 10a, 10b, 10c are formed analogously.

By way of example, the metal layer 7 is deposited to a thickness of, e.g., 1 µm along the z axis. What is proposed is that, first, only the first layer 7 is deposited, which preferably has a thickness in the order of around 1 µm. The first layer 7 is structured using a mask in a peripheral border 15 down to the top face 11 of the functional layer 6. This produces the peripheral border 15 around the bonding pads 10a . . . 10n, which border may, for example, have a border width of around 5 µm in an x direction or a y direction.

Figure 4:
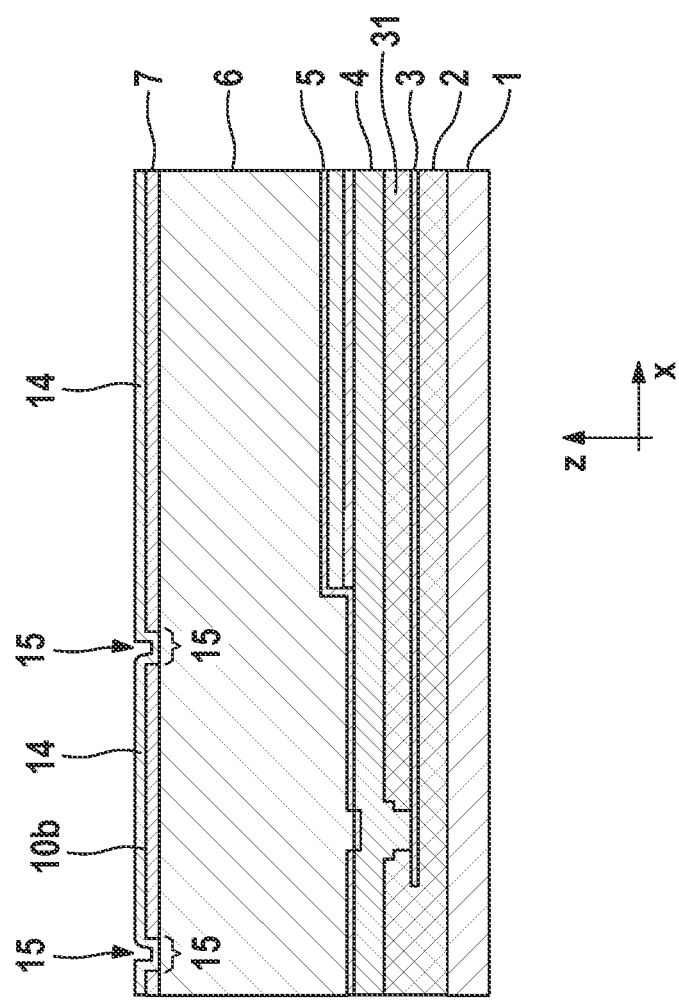

FIG. 4 is a cross-sectional view after a subsequent process step in which, in a further step, a second metal layer 14, preferably of a thickness of around 0.5 µm along the z axis, has been deposited onto the first metal layer 7, over the entire top surface of the first metal layer 7, and onto the top face 11 of the functional layer 6 in the region of the border 15 of the bonding pads 10a, 10b, 10c. The second layer 14 has a lower thickness along the z axis than the first layer 7 applied in the first step. The second layer 14 may consist of the same metal material as the first layer 7, or comprise a different metal material, or consist of a different metal material.

As a result, the entire applied layer consisting of the first and/or second metal layer(s) 7, 14 thus has a greater thickness, of around 1.5 µm for example, in the region of what will later be the bonding pad 10b than in the region of the border 15. In the region of the border 15, the second metal layer 14 may be formed, for example, having a thickness of around 500 nm. Therefore, the bonding pad 10b is initially formed 'in two stages' having two portions of different thicknesses. This is achieved in that the second deposition of the second metal layer 14 is deposited into the recesses of the border 15, which has been produced beforehand. This is achieved in that the entire layer has been deposited in the form of two successively deposited metal layers 7, 14 (the first and second metal layers).

Optionally, the entire metal layer 7, 14 may also be deposited in the form of two successively deposited layers 7, 14 comprising different metal materials. Advantageously, this makes it possible to deposit identical or different metal materials, it being possible, for example, for the first metal layer 7 to be deposited from e.g., Ti, and for the second metal layer 14 to be deposited from e.g., Al.

The topography of the sensor element, having numerous narrow and small trenches and in parts also undercuts and channels, may be unsuitable for wet chemical metal etching, in particular Al etching, or wet chemical cleaning, since the etching/cleaning solution cannot be removed without leaving residues.

As a result, the first and second metal layers 7, 14 can thus be used in the inertial sensor production process for both forming the bonding border and forming the bonding pads 10a . . . 10n.

Depending on the selected configuration, the bonding border may also be produced in a separate method.

Figure 5:
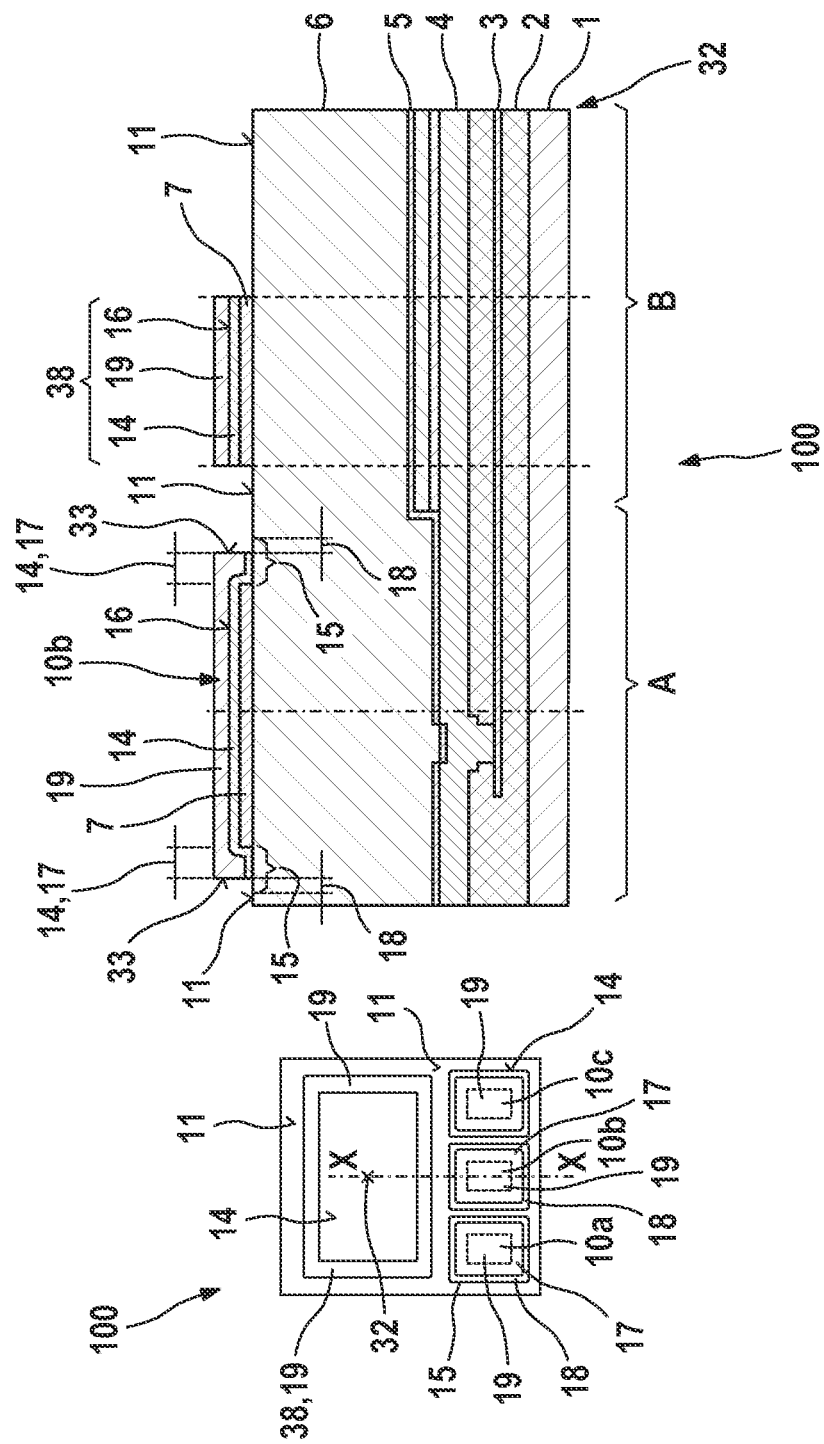

FIG. 5 shows the arrangement from FIG. 4 after a further process step. The left-hand portion shows a plan view of the structure; a protective layer 19 covers the bonding pads 10a, 10b, 10c, adjoining and inner peripheral portions 17 of the border 15, and a surface of a bonding border 38 extending all around in an annular manner. Outer portions 18 of the border 15 are not covered with the protective layer 19. By way of example, the protective layer 19 may be in the form of a finish layer. The figure shows bonding pads 10a, 10b, 10c formed from the first layer 7 and the second layer 14. The protective layer 19 is used as an etching mask for structuring or removing the first and/or the second layer(s) 7, 14 using an etching method.

The right-hand illustration in FIG. 5 is a cross section X-X through part of the left-hand illustration in FIG. 5 after the etching operation, the part-cross section leading through the middle bonding pad 10b as far as into a middle region 32 enclosed by the bonding border region B. In a middle region of the bonding pad 10b, the first layer 7 and the second layer 14 are arranged one on top of the other. In the inner peripheral portion 17 of the border 15, each bonding pad only has the second layer 14 on the functional layer 6, a top face 16 of the second layer 14 being covered with the protective layer 19 in this region too. In addition, one part of the bonding border 38, which is closed all the way around, is shown, said bonding border likewise being covered with the protective layer 19. The bonding border 38 is formed by the first layer 7 and the second layer 14. The first layer 7 and the second layer 14 have been removed in the regions of the top face 11 of the functional layer 6 that are not covered with the protective layer 19.

The bonding border 38 is structured using metal etching, the first and second layers 7, 14 being removed as far down as the top surface 11 of the functional layer 6 in order to form the bonding border 38. As a result, the bonding border 38 can preferably be structured at the same time as the bonding pads 10a, 10b, 10c. In another configuration, the bonding border 38 may also be produced having different layers and/or using different method steps from the bonding pads. Preferably, in the bonding pads 10a . . . 10c, a lateral marginal edge 33 of the protective layer 19 is located in the peripheral border 15 such that the lateral marginal edge 33 is positioned in the border 15, preferably in the middle of the border 15.

Advantageously, therefore, the lithography edge is not flush with the topography edge from the previous structuring. The resultant over-etching in the top face 11 of the functional layer 6 in the outer portion 18 of the border 15 is not critical in this part of the sensor element 100. By way of example, the functional layer 6 is formed from epitaxially deposited polysilicon 6. The inner portion 17 of the border 15 having a width of typically 2.5 µm in the y direction and the x direction corresponds to the resulting stripping of the second metal layer 14 from the side edge of the bonding pad 10a, 10b, 10c.

Limiting the over-etching to a minimum represents an advantageous specific embodiment, but there is no need to be limited thereto and other non-critical regions of the top face of the functional layer 6 may also be over-etched.

Figure 6:
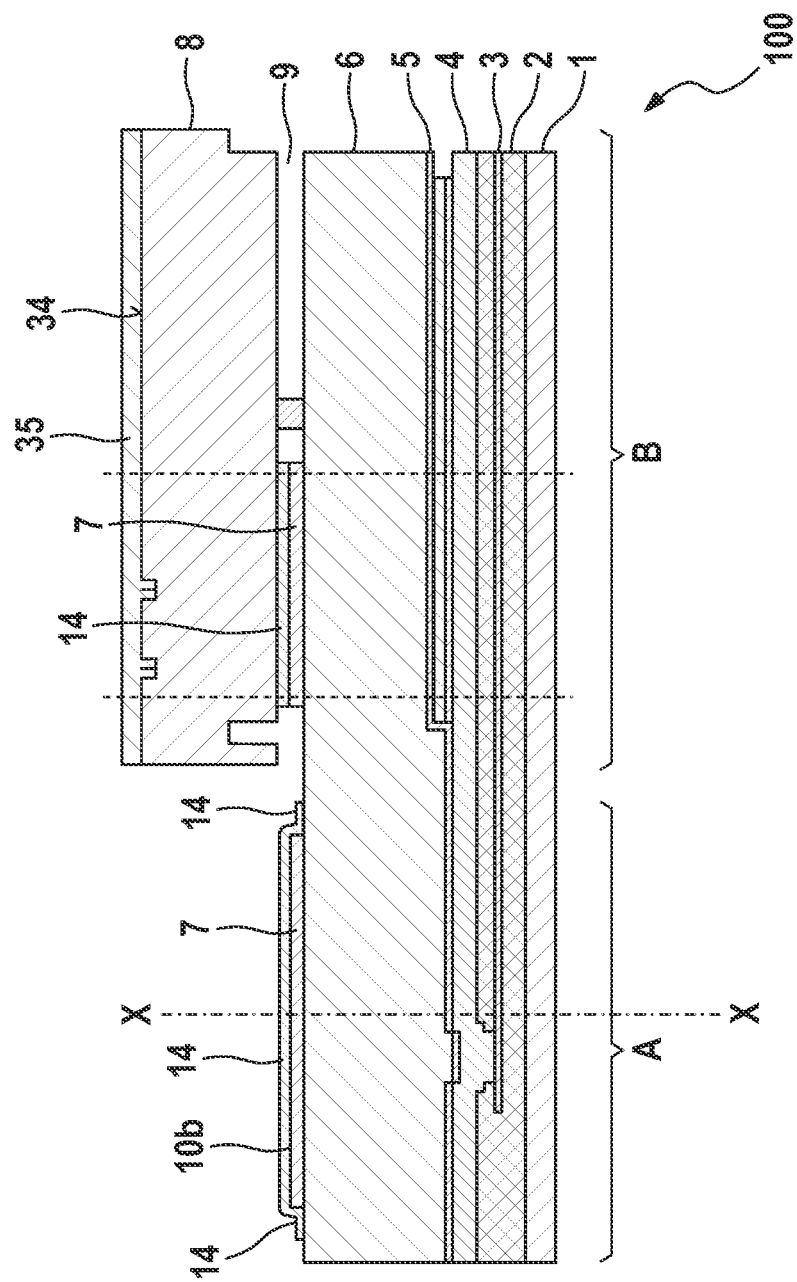

FIG. 6 shows the part-cross section from the right-hand illustration in FIG. 5 in a further process step, the protective layer 19 having been removed and a cap element 8 having been bonded to the functional layer 6 by way of the bonding border 38. The cavity 9 inside the bonding border 38 is formed in this way. In addition, a top face 34 of the cap element 8 is covered with a second protective layer 35.

Figure 7:
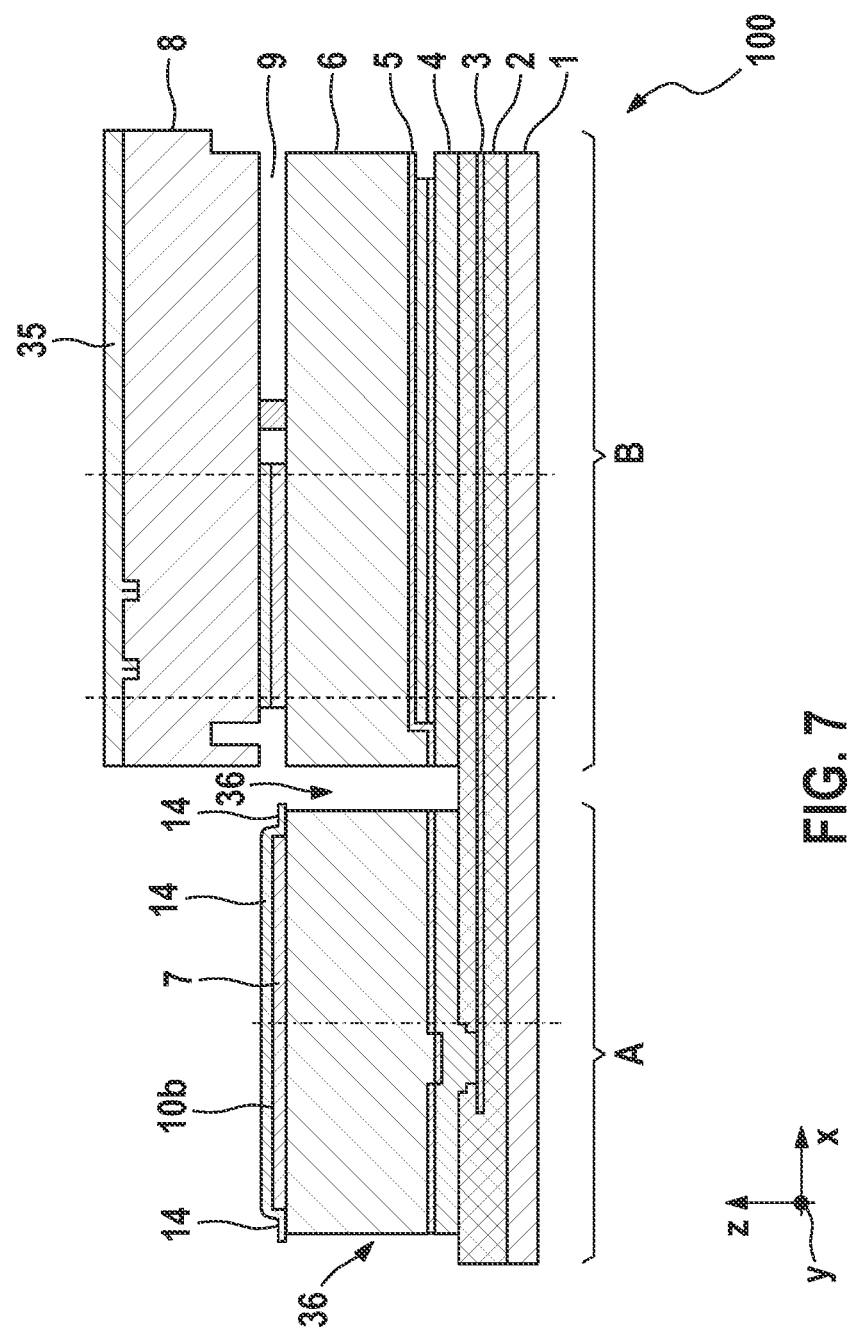

In a subsequent process step, which is shown in the cross-sectional view of FIG. 7, the bonding pad region A is separated from the bonding frame region B using an etching process by making a peripheral trench 36, thereby releasing the bonding pad 10b, which is arranged on a die 37 of the functional layer 6, from the rest of the functional layer 6. In this case, the second layer 14 and the second protective layer 35 serve as etching masks. It can also be seen that, after the etching operation, the second layer 14 protrudes sideways in the x direction and in the y direction 7a slightly beyond the side edges of the Si die of the bonding pad 10b.

Figure 8:
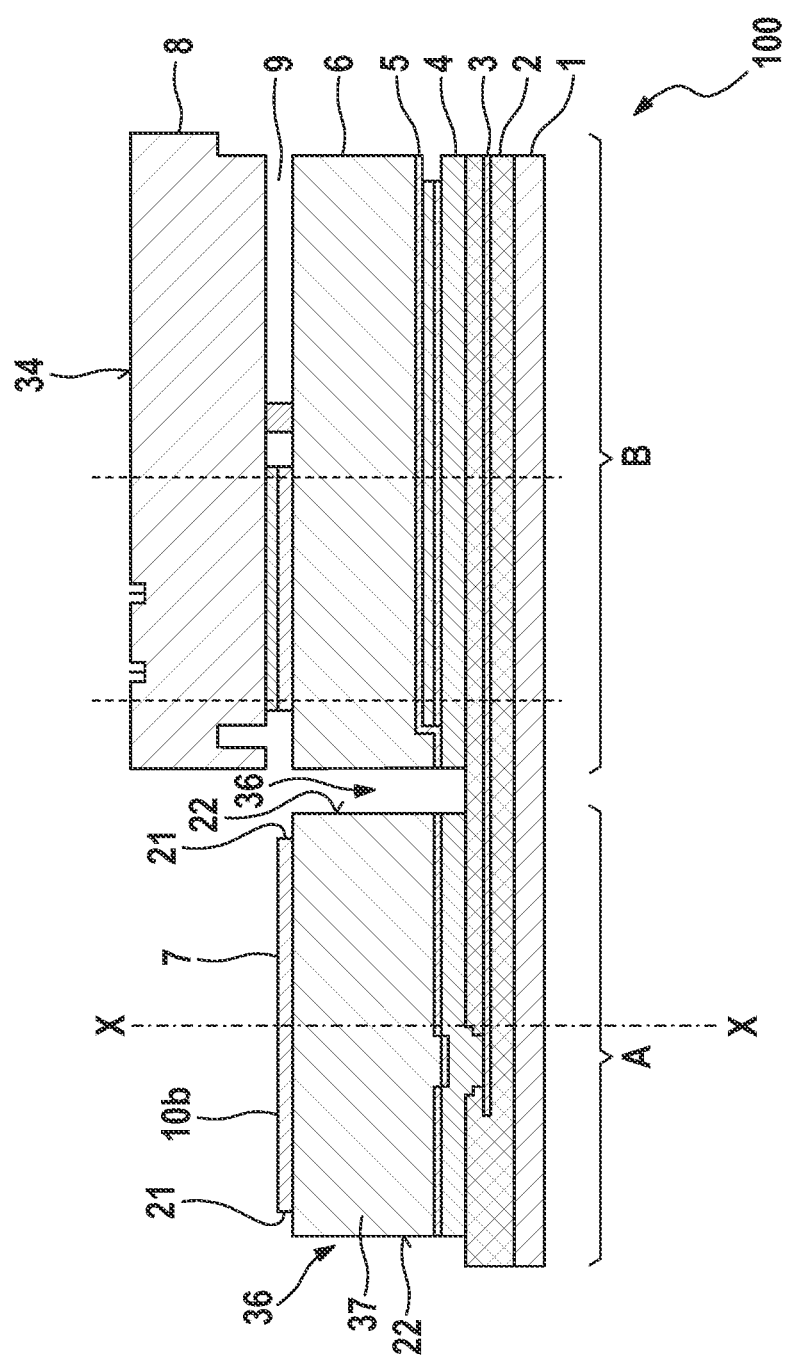

FIG. 8 shows the arrangement from FIG. 7 after a final process step using a gas phase etching process, a so-called 'blanket etching,' by which the second layer 14 is removed in the region of the inner portion of the border 15. In addition, the second protective layer has been removed from the top face 34 of the cap element 8. The thin second layer 14, which protrudes over the support of the bonding pad 10b, is thus removed from the border 15 over the entire surface. Bonding pad regions 10a, 10b, 10c are thus obtained which have a lateral edge region 21 that is arranged so as to be offset inward by a distance from a side face 22 of the die 37, i.e., of the bonding pad region of the functional layer 6. The blanket etching is carried out without any additional masking layer.

The gas phase etching process may be carried out, for example, using a plasma and an argon ion beam; by way of a defined safety margin, the entire metal layer consisting of the first and second layers 7, 14 is etched away in a targeted manner to a thickness of around 750 nm to around 800 nm. For this purpose, an ion beam etching process is preferably used, in which the entire top surface of the structure is non-selectively stripped by dry-chemical means through bombardment with inert or reactive ions. As a result, the 500-nm layer thickness of the second layer 14 is stripped in its entirety in the region of the border 15. After the dicing-by-grinding singulation process, the bonding pad 10b can be electrically contacted on the remainder of the metal layer of the bonding pad 10b using wire bonding. The around 750-nm layer thickness of the first layer 7 thus remaining on the bonding pad 10a . . . 10n is sufficient for subsequent wire bonding.

As a result, the die 37 of the functional layer 6 stops in the bonding pad region A at a side edge 22. It can be seen that the bonding pad 10b is inwardly offset from the side edge of the supporting die 37 in a well-defined manner. As a result, when removing a film during the dicing-by-grinding singulation process, it is not possible to tear off any particles of a portion, laterally protruding over the die 37, of the first or second metal layer 7, 14 of the bonding pad 10b. All the bonding pads are formed in an analogous manner.

In an alternative not shown in the drawings, the layer for masking the bonding pad region A may be deposited and structured first, said layer being thinner than the first layer 7 (around 0.5 μm). The thicker second layer 14 (around 1 μm) for the bonding pads 10a . . . 10n is then deposited and structured in a further step.

The thinner first layer and the thicker second layer may also be used to form the bonding border 38.

In the region of the bonding pad 10a . . . 10n, the anisotropic etching does not end at the base, and so the layer thickness and over-etching have to be suitably selected so as to ensure that the thin first layer that is deposited first still stops at a sufficient thickness for forming the bonding pads.

Using the bonding pads 10a . . . 10c produced in this manner, wire bonding can then be performed, as a result of which a reliable electrical connection can be produced between components that are to be connected, i.e., between the metal layer of the bonding pad 10a . . . 10n of the micromechanical sensor element and an ASIC element that evaluates the sensor signals from the micromechanical sensor element.

The metal layer 7 of the bonding pad 10a . . . 10n represents the last metal layer of the micromechanical sensor element; the layer thickness thereof is in a range from around 0.5 μm to around 2 μm. A typical edge length of a surface of the electrical contact region of the bonding pad 10a . . . 10n is around 60 μm to around 80 μm.

Advantageously, the proposed method can be carried out as part of a standard inertial sensor process.

Figure 9:
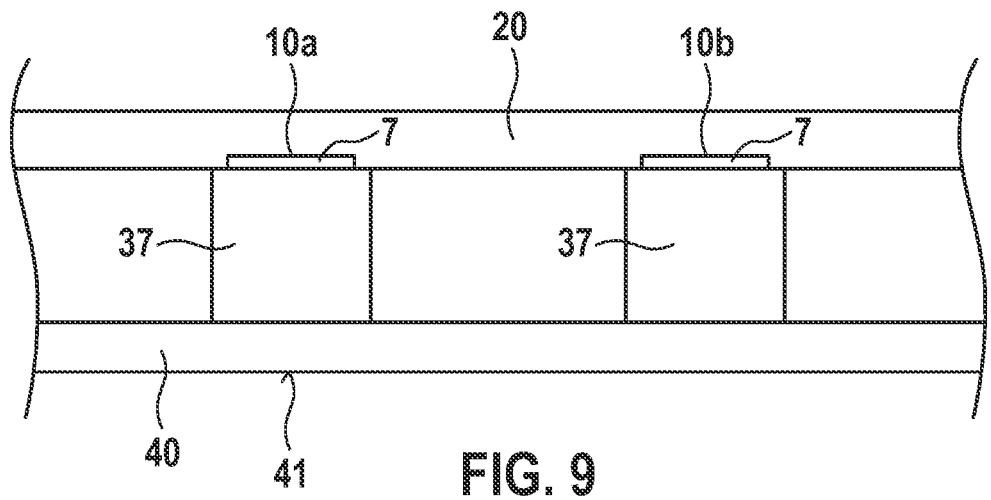
FIGS. 9 and 10 are schematic illustrations of a dicing-by-grinding separation process.
Figure 10:
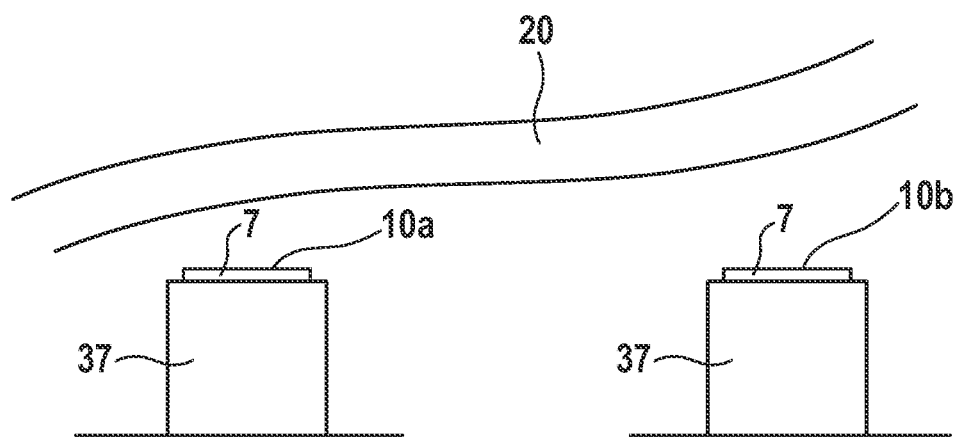

FIG. 9 is a highly simplified illustration of a dicing-by-grinding singulation process. In this case, a film 20 is laminated under vacuum onto the bonding pads 10a, 10b, the film 20 being easily deformable and easily stretchable. Owing to the specific shape of the bonding pads 10a, 10b, the film 20 cannot form the side edges, which are set back inward from the outer edge 22 of the die 37, over an overhanging layer edge. Next, resin (not shown) is poured onto the arrangement in order to planarize the entirety thereof; afterwards, the entire wafer 40 is flipped onto its back and thus comes to rest on the film 20 (not shown). The entire arrangement is placed on a polishing platform (not shown), the arrangement being polished so far down from an underside 41 of the wafer 40 that chips comprising micromechanical sensor elements are singulated at the end. As soon as the chips comprising the micromechanical sensor elements are singulated, the chips are detached from the film 20 again. As a result, singulated inertial sensor chips are available thereafter, as indicated in FIG. 10 in a highly simplified manner. Once the dicing by grinding is complete, a wire bonding process can be carried out to electrically contact the micromechanical sensor element 100 with an ASIC.

Figure 11:
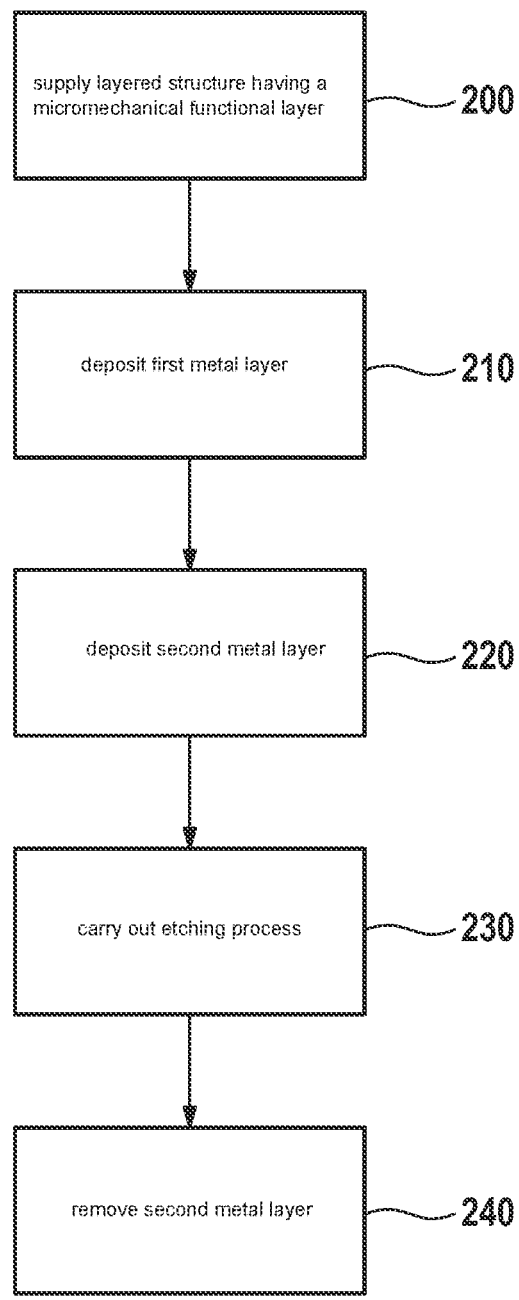
FIG. 11 shows a schematic sequence of the method according to an example embodiment of the present invention.

FIG. 11 shows a simplified schematic sequence of the proposed method.

In a step 200, a layered structure having a micromechanical functional layer 6 is supplied.

In a step 210, in a first step a first metal layer 7 of a first defined thickness is deposited onto a top face of the layered structure, a border 15 being worked off in the first metal layer 7, the border 15 extending down to a top face 11 of the micromechanical functional layer 6.

In a step 220, in a second step the second metal layer 14 of a second defined thickness is deposited onto the top face of the first layer 7 and is deposited onto the top face 11 of the functional layer in the region of the border 15.

In a step 230, an etching process is carried out using the layered structure, down to a top face of a conductor layer 4, in order to separate a bonding pad region A comprising the bonding pad 10a . . . 10n from a bonding frame region B.

In a step 240, the second metal layer 14 is removed in the border 15 using an unmasked etching process.

In summary, using the proposed method, a bonding pad can be produced by which a dicing-by-grinding step for singulating micromechanical sensor elements, e.g., MEMS inertial sensor elements, can be carried out in an advantageous manner.

Although the present invention has been described above on the basis of concrete example applications, a person skilled in the art may also implement specific embodiments that are not disclosed or are only disclosed in part without departing from the core concept of the present invention.

What is claimed is:

1. A method for producing a bonding pad for a micromechanical sensor element, comprising the following steps:
supplying a layered structure having a micromechanical functional layer on a top face of the layered structure;
depositing a first metal layer of a first thickness onto a top face of the functional layer, and depositing a second metal layer of a second thickness onto the first metal layer, wherein either only the first layer or only the second layer is formed in a border region extending around a bonding pad region;
covering a protective layer over a top face of the second metal layer in the bonding pad region and over the first or second metal layer in an inner peripheral portion of the border region, the inner peripheral portion adjoining the bonding pad region;
etching the first or second layer at least in an outer peripheral portion of the border region down to the top face of the functional layer to provide an exposed outer portion of the border region, wherein the inner peripheral portion of the border region remains covered with the first layer;

removing the protective layer;

carrying out an etching process in the exposed outer portion of the border region starting from the top face of the layered structure, wherein a bonding pad region having the bonding pad is released from a surrounding bonding frame region, wherein the second layer is used as an etching mask; and removing the first or second metal layer from the inner peripheral portion of the border region using an unmasked etching process so as to obtain a bonding pad having a peripheral edge region, wherein the edge region is inwardly set back from a peripheral side face of the bonding pad region of the functional layer.

2. The method as recited in claim 1, wherein, before the bonding frame region is released, a cap element is fastened to the top face of the functional layer next to the bonding pad by way of a bonding border, and wherein a top face of the cap element is covered with a second protective layer.

3. The method as recited in claim 1, wherein the bonding pad includes a plurality of bonding pads, and wherein a bonding border for connecting a cap element to the functional layer is produced next to the bonding pads at the same time as the bonding pads using the first and/or second layer.

4. The method as recited in claim 1, wherein the border is formed having a width of around 1.5 µm to 3 µm.

5. The method as recited in claim 1, wherein the first metal layer is deposited at a thickness that is at least 20% greater than the second metal layer.

6. The method as recited in claim 1, wherein the second metal layer is deposited at a thickness that is at least 20% greater than the first metal layer.

7. The method as recited in claim 1, wherein the first metal layer is deposited at a thickness of around 1 µm.

8. The method as recited in claim 1, wherein the second metal layer is deposited at a thickness of around 0.5 µm.

9. The method as recited in claim 1, wherein the second metal layer or the first metal layer is removed from the border region using a dry ion beam etching process, wherein the first or second metal layer is non-selectively stripped using a plasma having an argon ion beam.

10. The method as recited in claim 1, wherein the first metal layer and the second metal layer are deposited from the same material or from different materials.

11. The method as recited in claim 1, wherein the first metal layer and/or the second metal layer consists of aluminum or at least includes aluminum.

12. The method as recited in claim 1, wherein the first layer includes titanium or consists of titanium, and wherein the second layer includes aluminum or consists of aluminum.

13. The method as recited in claim 1, wherein the bonding pad includes a plurality of bonding pads, and wherein, for the purpose of separating micromechanical sensor elements from an array of sensor elements, a film is applied to a top face of the sensor elements and to the bonding pads of the sensor elements, wherein the sensor elements are separated from one another, and wherein the film is then removed from the sensor elements again.

14. A micromechanical sensor element, comprising:
at least one bonding pad, the at least one bonding pad having been produced by the steps of the method of claim 1.

* * * * *